United States Patent [19]

Jeong et al.

[11] Patent Number: 5,744,827
[45] Date of Patent: Apr. 28, 1998

[54] THREE DIMENSIONAL STACK PACKAGE DEVICE HAVING EXPOSED COUPLING LEAD PORTIONS AND VERTICAL INTERCONNECTION ELEMENTS

[75] Inventors: Do Soo Jeong; Min Cheol An; Seung Ho Ahn, all of Suwon; Hyeon Jo Jeong, Pyungteck; Ki Won Choi, Suwon, all of Rep. of Korea

[73] Assignee: Samsung Electronics Co., Ltd., Suwon, Rep. of Korea

[21] Appl. No.: 753,532

[22] Filed: Nov. 26, 1996

[30] Foreign Application Priority Data

Nov. 28, 1995 [KR] Rep. of Korea .................. 95-44249

[51] Int. Cl.$^6$ .................. H01L 23/48; H01L 25/04; H01L 23/02; H01L 23/495
[52] U.S. Cl. .................. 257/686; 257/692; 257/673; 257/693; 257/698; 257/696; 257/737
[58] Field of Search .................. 257/686, 669, 257/672, 673, 674, 676, 685, 692, 693, 696, 698, 737, 738, 784, 666, 706, 723, 730, 731

[56] References Cited

U.S. PATENT DOCUMENTS

| | | | |
|---|---|---|---|
| 5,365,107 | 11/1994 | Kuraishi et al. | 257/673 |
| 5,519,251 | 5/1996 | Sato et al. | 257/666 |
| 5,583,371 | 12/1996 | Hori | 257/676 |
| 5,583,375 | 12/1996 | Tsubosaki et al. | 257/686 |
| 5,608,265 | 3/1997 | Kitano et al. | 257/737 |
| 5,612,569 | 3/1997 | Murakami et al. | 257/66 |
| 5,621,242 | 4/1997 | Mok et al. | 257/669 |
| 5,625,221 | 4/1997 | Kim et al. | 257/723 |

FOREIGN PATENT DOCUMENTS

| | | | |
|---|---|---|---|
| 60-171754 | 9/1985 | Japan | 257/686 |
| 60-194548 | 10/1985 | Japan | 257/686 |
| 2-1962 | 1/1990 | Japan | 257/686 |
| 6-29429 | 2/1994 | Japan | 257/666 |

*Primary Examiner*—Tom Thomas
*Assistant Examiner*—Alexander Oscar Williams
*Attorney, Agent, or Firm*—Jones & Volentine, L.L.P.

[57] ABSTRACT

A three dimensional stack package device that can realize vertical electrical interconnection of the stacked individual package devices without a cost increase or additional complicated processing steps. The three dimensional package device includes a plurality of individual semiconductor devices, each individual semiconductor device including (1) a semiconductor chip, (2) a protective body for encapsulating the semiconductor chip, (3) a lead frame comprising inner lead portions electrically interconnected to the semiconductor chip and included within the protective body, outer lead portions formed as a single body with the inner lead portions, and coupling lead portions located between the inner and outer lead portions and having a top surface exposed upward from the protective body, and (4) a plurality of vertical interconnection elements attached to a back surface of the coupling lead portions and exposed from the protective body in a direction opposing the exposed top surface of the coupling lead portions, whereby, an electrical interconnection of the plurality of individual semiconductor devices is accomplished by the coupling lead portions and the vertical interconnection elements, and electrical interconnection of the three dimensional stack package device to an external circuit device is accomplished by the outer lead portions of a lowermost semiconductor device.

28 Claims, 12 Drawing Sheets

THREE DIMENSIONAL STACK PACKAGE DEVICE HAVING EXPOSED COUPLING LEAD PORTIONS AND VERTICAL INTERCONNECTION ELEMENTS

BACKGROUND OF THE INVENTION

1. Field of the Invention

The present invention generally relates to semiconductor chip packages, and more particularly, to a three dimensional stack integrated circuit package device in which each of individual stacked chip packages has exposed coupling lead portions between inner and outer lead portions. Electrically conductive vertical interconnection means are attached to back sides of the exposed coupling lead portions, so that electrical and mechanical interconnections of neighboring stacked chip packages are accomplished by the coupling leads and the vertical interconnection means.

2. Description of the Related Arts

Presently, most VLSI circuit chips are packaged by organic polymeric encapsulants such as thermoplastics, thermosets and elastomer, or hermetically sealed with metal lids in order to protect the chips from a hostile environment and to ensure the operational functionality and reliability of the chips. For connecting the integrated circuit chip to external circuitry, some means must be available for transferring signals and power into and out of the IC chip. For instance, metal leads protruding outwardly from the protective package body are either inserted into sockets or through holes formed in a Printed Circuit Board (pin insertion type) or soldered on bond fingers of the PCB (surface mounting type). The metal leads are also connected to electrode bonding pads of the chips by way of bonding wires or metal bumps.

Typical integrated circuit packages contain only one circuit chip. The final packaged device has an area many times that of the circuit chip. In order to satisfy the requirements for increasing the density of electronic devices of a system, attempts have been made to employ multichip packing or multichip module technologies. The multichip module provides the interconnection capability and desired design flexibility for the packaging. In the multichip module (MCM), the need to package each individual chip is eliminated by mounting multiple non-packaged bare chips directly onto a high-density, fine-pitch interconnection substrate that provides the chip-to-chip interconnection with the module. Chip-to-chip distances are thereby reduced, leading to denser assemblies and shorter and faster interconnection.

However, this multichip module technology has its own technical limits. When a number of IC chips are to be mounted on a single substrate, very fine wiring patterns are required, which do not crossover each other for preventing an electrical short circuit. But it is difficult to form fine pitch conductive lines on the ceramic substrate. Thus, a multilayered ceramic substrate of conductive lines is typically used. However, this also has some disadvantages in that the production cost of the multi-layered substrate is somewhat high, and the heat dissipation capability of the substrate is limited to a certain extent. Moreover, since the multichip module approach employs a number of non-packaged bare chips, it is difficult to repair defective chips and to carry out a burn-in test for screening out weak bare chips.

In spite of these disadvantages, the advent of the MCMs has reduced signal transfer delay time, reduced electrical noise or crosstalk, and resulted in a smaller size for the final packaged device. Moreover, an IC chip of larger size can be mounted on the same sized substrate that is used in normal packaging technologies, and the number of input/output leads per unit module is significantly increased.

In the meantime, in order to overcome the disadvantages of the MCM, such as the limited heat dissipation and burn-in test difficulties, while still maintaining the advantage of the small sized packaged device, a stack packaging technology has been developed which employs a number of packaged individual IC devices rather than the bare chips. In the stack package, the individual packaged devices are stacked three dimensionally as disclosed in e.g., U.S. Pat. Nos. 5,138,438, 5,172,303 and 4,763,188. These three dimensional packages are suitable for use in super computers or large cache memory devices requiring higher speeds, shorter access time, and larger capacity.

Greater difficulty is encountered in realizing electrical vertical interconnections of the individual packaged devices and the heat dissipation of the three dimensional package, than in the normal planar packaging device. In order to solve the problems associated with the vertical interconnection, additional processes have to be carried out after completing the individual packaging operation or a different assembly process should be introduced. However, these solutions may cause an increase in the production cost and the complexity of assembly process. Further, for heat dissipation, additional cooling means such as a heat sink or heat spreader must be incorporated, resulting in an increased cost and larger sizes.

SUMMARY OF THE INVENTION

Accordingly, it is an object of the present invention to provide a simple and convenient interconnection means for a three dimensional integrated circuit package device without increasing the cost or incorporating additional complicated processes.

It is another object of the present invention to provide a three dimensional integrated circuit package device employing the processes and the apparatus used in conventional packaging operations, thereby reducing the production cost and ensuring the stability of the package device.

It is still another object of the present invention to enhance the thermal dissipation capability of the three dimensional integrated circuit package device.

According to a particular aspect of the present invention, there is provided a three dimensional integrated circuit package device comprising a plurality of individual semiconductor devices, each of the individual semiconductor devices comprising (1) a semiconductor chip, (2) a protective body for encapsulating the semiconductor chip, (3) a lead frame comprising inner lead portions which are electrically interconnected to the semiconductor chip and included within the protective body, outer lead portions formed as a single body with the inner lead portions, and coupling lead portions located between the inner and outer lead portions and having a top surface exposed upward from the protective body, and (4) a plurality of vertical interconnection means attached to a back surface of the coupling lead portions and exposed from the protective body in a direction opposing the exposed top surface of the coupling lead portions, whereby an electrical interconnection of the plurality of individual semiconductor devices is accomplished by the coupling lead portions and the vertical interconnection means, and an electrical interconnection of the three dimensional integrated circuit package device to an external circuit device is accomplished by the outer lead portions of a lowermost semiconductor device.

BRIEF DESCRIPTION OF THE DRAWINGS

FIGS. 3A and 3B are front cross sectional views of individual chip packages having a vertical interconnection means, in which FIG. 3A shows a surface mounting type chip package, and FIG. 3B shows a pin insertion type chip package;

DETAILED DESCRIPTION OF THE PRESENT INVENTION

Figure 1A:
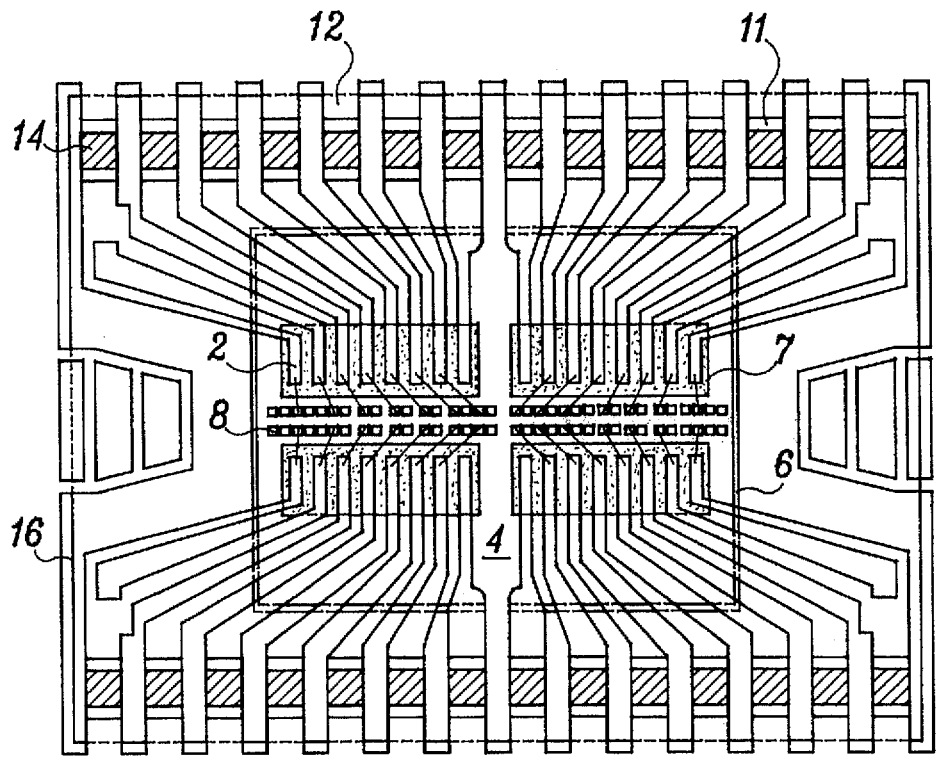
FIGS. 1A and 1B are, respectively, a plan view and a front cross sectional view of an individual chip package suitable for use in a three dimensional stack package device according to the present invention.
Figure 1B:
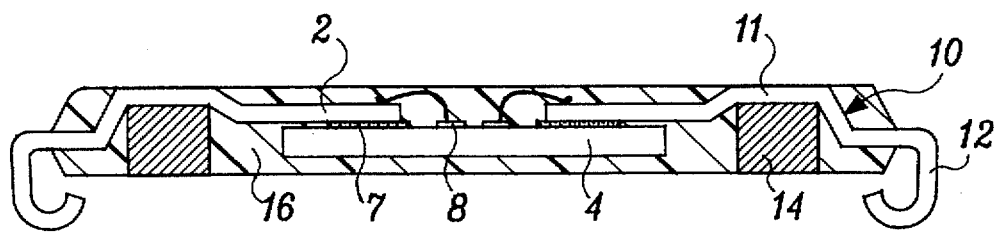

FIGS. 1A and 1B show an individual chip package suitable for use in a three dimensional package device according to the present invention. The individual chip package is of the so called Lead On Chip (LOC) type. In the package shown, inner lead frame leads 2 are placed over the top surface 6 (i.e., an active surface on which the desired integrated circuit elements are formed) of a semiconductor chip 4, and then are attached to the top active surface 6 of the chip by an adhesive 7 interposed therebetween. In the LOC type package, as compared to the typical edge bonding pad type of chip package, the overall size of the device can be reduced and noise components caused by inductive effects of the interconnection lines can be significantly reduced. This is because the electrode bonding pads 8 are arranged in the central region of the active surface 6 of the chip 4 and the inner leads 2 reach the central region of the active surface 6.

As shown in FIGS. 1A and 1B, lead frame 10 comprises inner lead portions 2, coupling lead portions 11 and outer lead portions 12. For electrically interconnecting the semiconductor chip 4 to an external device using the inner leads 2, the lead frame 10 must be made of conductive materials such as copper (Cu) alloys or iron (Fe) alloys. In addition to the electrical conductivity, the lead frame must satisfy many properties including corrosion resistance, solderability, coefficient of thermal expansion, and fatigue properties. The outer leads 12 are in a direct contact with the wiring patterns of an external circuit board (not shown), and are formed into suitable configurations for the circuit board, e.g., J-shaped as shown in FIG. 1B. The coupling lead portions 11 are between the inner and outer lead portions. However, it should be noted that each lead portion is named only for identifying the function of the particular portion of the lead frame lead, it being understood that the three portions of the lead are integrated as one body.

Referring to FIG. 1B, the coupling leads 11 are bent upward so as to reach the upper surface of the package body 16. Vertical interconnection means 14 are attached to bottom surfaces of the coupling leads. The lead portions 11 are so named "coupling lead portions" because when a plurality of individual chip packages are stacked three dimensionally, the lead portion 11 assumes the role, together with the vertical interconnection means, of coupling the upper and the lower chip packages mechanically and electrically. As depicted in FIG. 1B, the coupling leads 11 must reach the upper surface of the final individual chip package and thus be exposed. In addition, the vertical interconnection means 14 have to be exposed from the bottom surface of the chip package after the formation of the package body 16 is completed. For example, in a transfer molding process which makes the package body by injecting Epoxy Molding Compound into a cavity under high temperature and high pressure conditions, the coupling leads and the vertical interconnection means can be exposed by properly controlling the depth of the cavity determined by the top and bottom molds.

The vertical interconnection means 14 are made of the same material as the lead frame 10, or of a higher electrically conductive material than the lead frame.

Figure 2A:
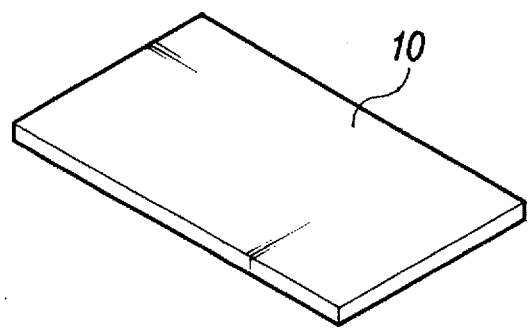
FIGS. 2A to 2F are schematic diagrams for showing a manufacturing processes for a lead frame having a vertical interconnection means suitable for use in the three dimensional stack package device according to the present invention.
Figure 2B:
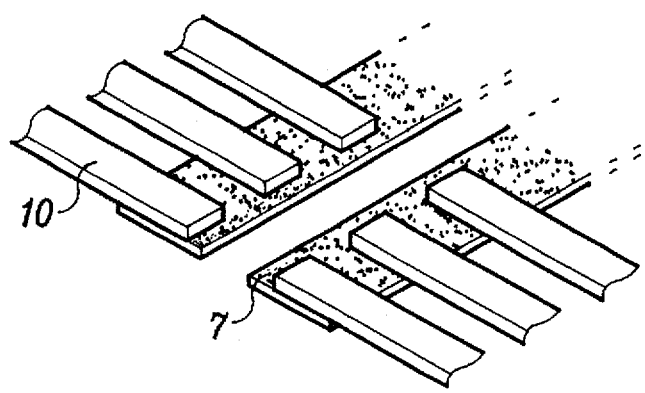
Figure 2C:
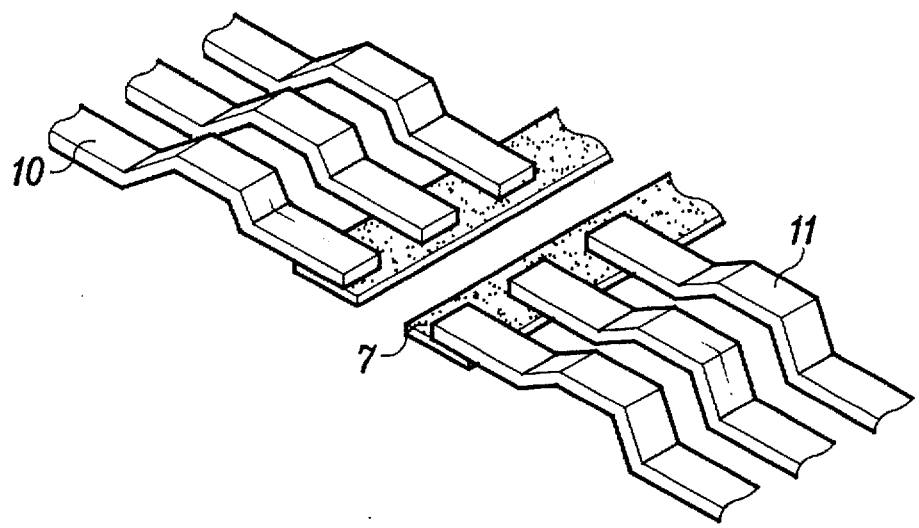
Figure 2D:
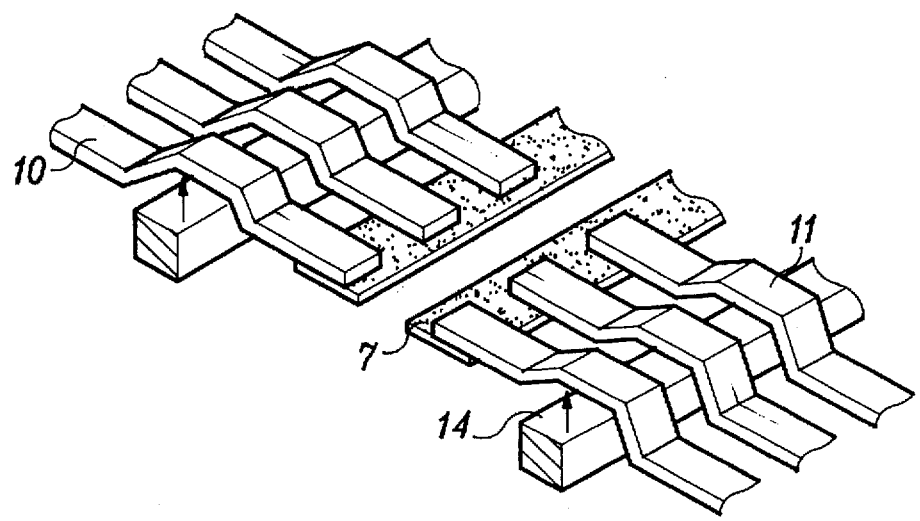

FIGS. 2A through 2F are schematic diagrams for showing the manufacturing process for the lead frame having the vertical interconnection means. In the first step, the starting material of the lead frame 10 of Cu-alloy or Fe-alloy is prepared (FIG. 2A). Then, by using an etching method or a stamping technology, lead patterns as shown in FIG. 1B and formed (FIG. 2B). The coupling leads 11 are formed by bending the central portion of the lead frame lead as shown in FIG. 2C. The vertical interconnection means 14, having a bar shape, is attached to the bottom surfaces of the coupling leads 11 as shown in FIG. 2D. The attachment of the vertical interconnection means to the coupling leads is done by compressing them under high temperature and pressure or by using an electrical conductive adhesive material therebetween.

Figure 2E:
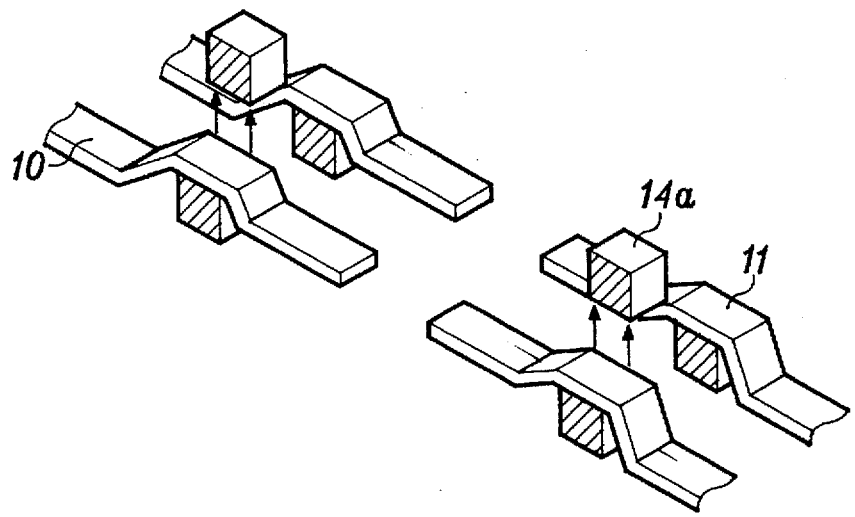

Unnecessary portions 14a of the vertical interconnection means 14, namely, those portions between neighboring coupling leads, are then severed and removed by a punching method in order to prevent an electrical short between the neighboring leads (FIG. 2E). After inspecting the alignment and attachment of the vertical interconnection means and shape of the lead frame lead in FIG. 2F, a lead frame having the vertical interconnection means attached is obtained.

Figure 2F:
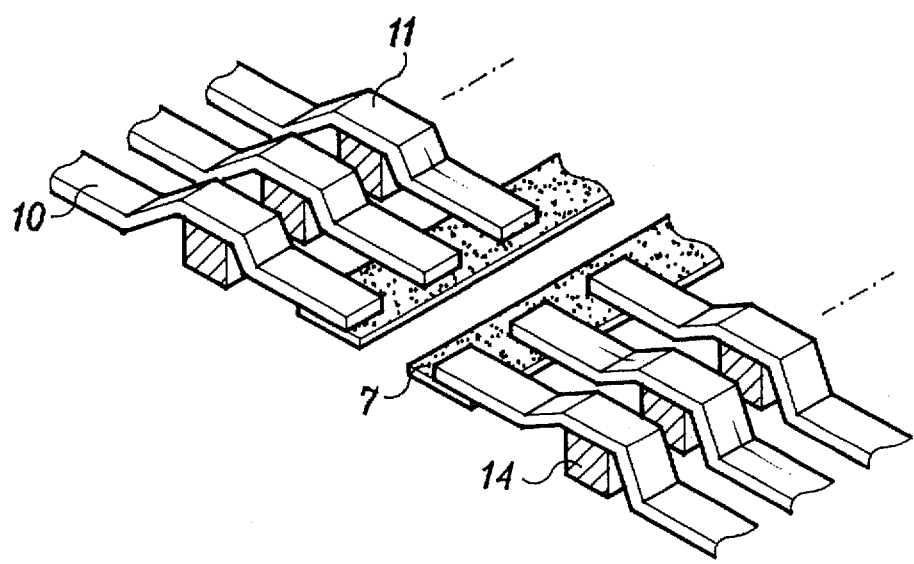

Polyimide tape 7 is typically used in the LOC package to attach the inner lead to the top surface of the chip. For facilitating the wire bonding to the inner lead surface, Ag-plating is generally used. The polyimide tape and the Ag-plating may be formed either after the etching or stamping step of FIG. 2B or after the lead frame formation is completed (FIGS. 2E and 2F).

The lead frame 10 thus formed is laid on and aligned with the semiconductor chip 4, and inner leads 2 are attached to the chip active surface by way of the adhesive 7. After electrically connecting the inner lead 2 to the electrode bonding pad 8, the protective body is formed, e.g., by a transfer molding method as indicated by the dot-dashed line 16 in FIG. 1A. Then, by forming the outer leads 12 in a desired shape, an individual chip package suitable for use in the three dimensional integrated circuit package device of the present invention can be obtained.

Figure 3A:
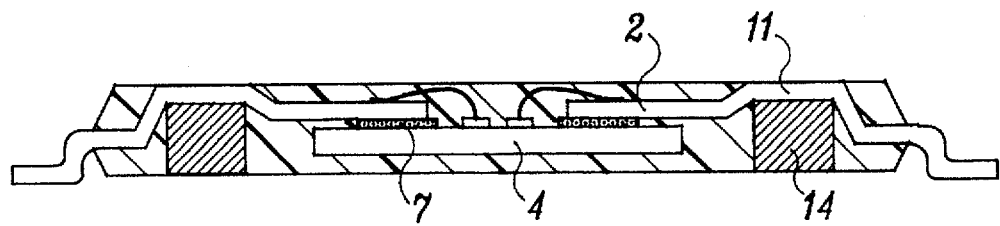
Figure 3B:
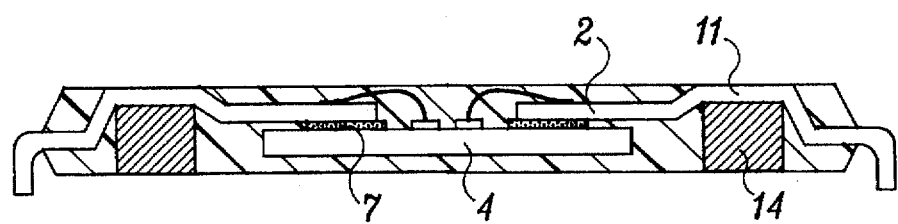

If the outer leads are formed into a J-shape as shown in FIG. 1B, the chip package will be used as SOJ, TSOJ, MSOJ or PLCC type package devices. On the other hand, if the outer leads are bent in a gull-wing shape as shown in FIG. 3A, the chip package can be used as SOP, TSOP or QFP typed devices. If the outer leads are bent as shown in FIG. 3B, the chip package will be mounted on a circuit board in a pin insertion fashion, e.g., DIP, SIP or ZIP type package devices.

Figure 4:
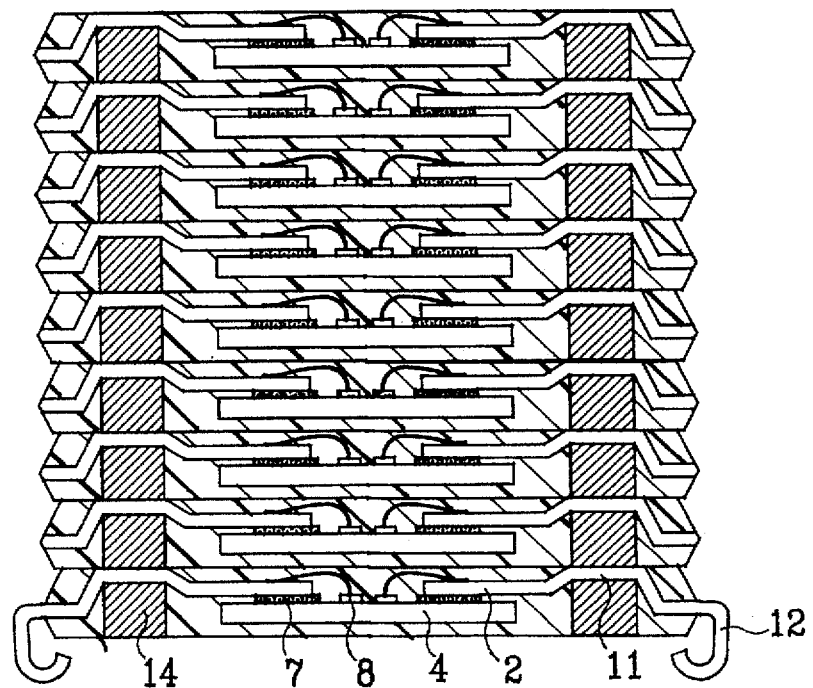
FIG. 4 is a cross sectional view of the three dimensional stack package device in which nine individual chip packages are stacked.

FIG. 4 is a cross sectional view of the three dimensional stack package device in which nine individual chip packages are stacked. After the package body of the individual chip packages are formed by a molding process, the outer leads are subjected to a surface treatment where the outer leads are typically electro-plated with a tin-lead alloy. With the present invention, since the outer lead, the coupling lead and the vertical interconnection means are all exposed from the package body, the tin-lead alloy is plated to the exposed components during the electro-plating process.

For surface mounting to a PCB, the lowermost package has its outer leads plated with a typical eutectic composition of 63 percent tin and 37 percent lead or with a composition of 62 percent tin—36 percent lead—2 percent silver alloy for a reflow soldering process.

For stacking the individual packages, a solder flux, such as rosin-based fluxes and water-soluble fluxes, is applied to the exposed coupling leads and the vertical interconnection means to be joined. The exposed coupling lead of the individual chip package may be additionally painted with a solder cream which is a mixture of finely powered solder in a viscous vehicle containing a fluxing agent. The solder cream can be used as a fluid preform that is capable of being shaped and molded to fit the application. After stacking nine individual chip packages, each of the coupling leads are coupled to corresponding ones of the vertical interconnection means by a solder reflow process at a temperature of approximately 180° C. or above. This makes possible the electrical interconnection of the individual chip packages.

For improving the strength of the solder joints, the reflow soldering may be carried out after screen printing a solder paste on regions of the coupling lead where the vertical interconnection means are to be contacted and coupled. Further, in order to provide paths through which air contained between neighboring package bodies can be removed during the reflow soldering process, the coupling lead and the vertical interconnection means protrude from the upper and bottom surface of the package body. If the air is not drawn off, the coupling of the stacked packages is weakened. The extent of the protrusion of the exposed components can be determined during a molding process for making the package body.

As a result, in the present invention, soldering failures and electrical short circuit problems, which occurred in the prior art three dimensional stack packages, can be prevented. These disadvantages of the prior art will be worse as lead pitch becomes finer, and warpage of the package or co-planarity of the leads becomes poorer as the pin count increases. In the mean time, when nine individual chip packages are to be stacked as shown in FIG. 4, the forming of the outer leads is carried out on only the lowermost chip package, and the outer leads of the remaining eight individual chip packages are simply cut off and removed. As a result, the processing step is simplified, and thus some benefits can be obtained, such as reducing failures and decreasing costs. The outer leads of the lowermost chip package are formed into their final configuration in a surface mounting type (J-leaded or Gull-wing) or in a pin insertion type.

Figure 5:
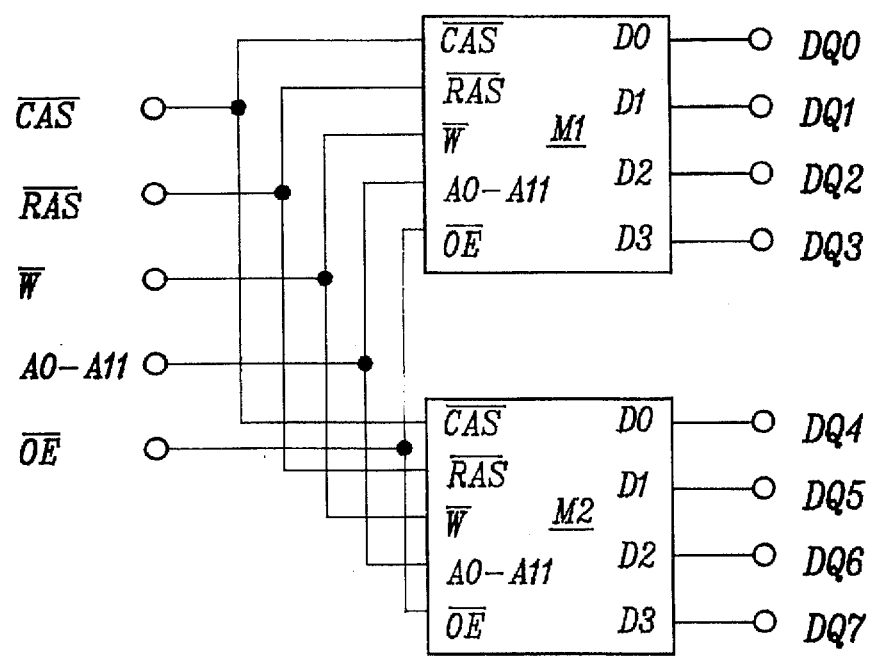
FIG. 5 is a block circuit diagram of a 4MX8 memory module of three dimensional stack chip packages according to the present invention.

FIG. 5 is a block diagram of a 4MX8 memory module of three dimensional stack chip packages according to the present invention. The stacked chips are 16M DRAM devices (M1 and M2), and each of the memory devices has four bits of data input/output, i.e., 4MX4 memory device. Control signals such as RAS (Row Address Strobe), CAS (Column Address Strobe), OE (Output Enable), W (Write) for controlling the operation of each memory chip, and address signals A0 to A11 for addressing a plurality of storage cells contained in each memory chip are commonly connected to each module device, respectively. However, input-output pins D0 to D3 of each memory chip comprise module input/output pins DQ0 to DQ7, and, therefore, the total number of the module input/output pins are eight from DQ0 to DQ7.

Figure 6:
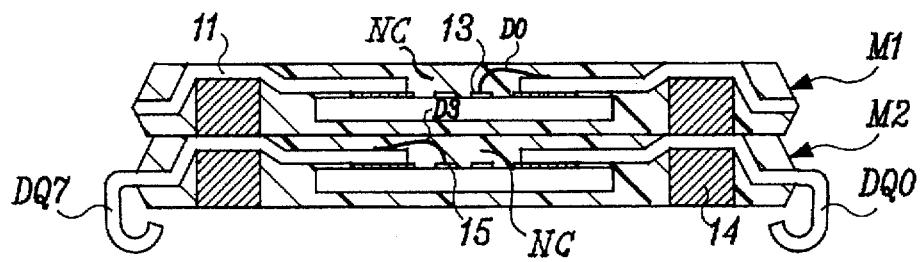
FIG. 6 is a cross sectional view of an exemplary three dimensional stack package device used as the memory module of FIG. 5.

FIG. 6 is a cross sectional view of an exemplary three dimensional stack package device realizing the memory module of FIG. 5. As explained hereinabove, the control signals, power signals and address signals for each of the individual chip packages M1 and M2 are provided through common module pins. Accordingly, inner leads to be connected to the common pins must be connected by wires to the corresponding electrode bonding pads of the chips. But, module data input/output DQ pins must be connected to the individual chip packages, separately. For instance, a D0 terminal 13 of memory chip M1 is designed to be connected to an external circuit board through outer lead DQ0 of the lowermost memory chip M2. Accordingly, a lead corresponding to the D0 terminal 13 of the uppermost memory chip M1 must be electrically interconnected to the electrode pad of the chip M1 by a bonding wire. However, the corresponding electrode bonding pad of memory chip M2 must not be connected to leads, and this is designated by NC in FIG. 6, meaning no connection. Input/output terminal 13 of the memory chip M1 is electrically connected to the outer lead of the lowermost memory chip M2 and finally to module DQ0 pin by way of the coupling leads 11 and the vertical interconnection means 14.

Similarly, since the DQ7 terminal of the memory module should be connected to the D3 terminal 15 of the memory chip M2, inner leads of memory chips M1 corresponding to the DQ7 terminal are NC. For the remaining DQ2 to DQ6 terminals, an electrical interconnection of the bonding pad and the inner lead is constructed in the same way explained above. In conclusion, each memory chip is required to have enough space to accommodate four non-connected leads.

Figure 7:
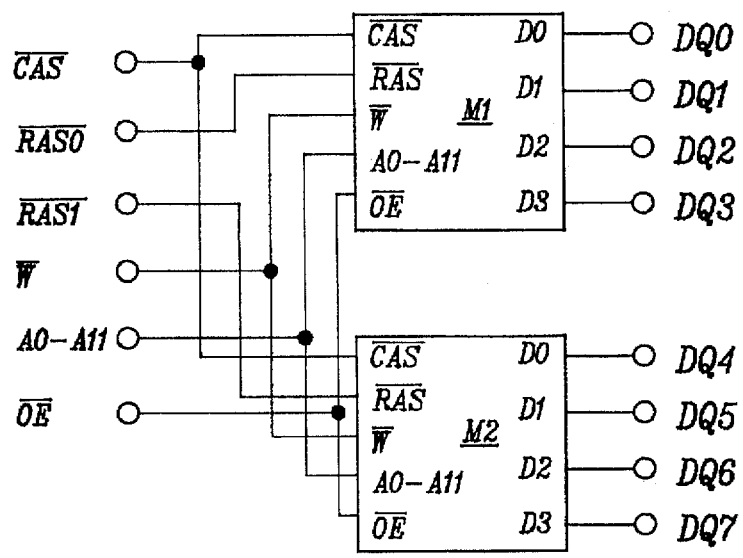
FIG. 7 is a block circuit diagram of another 4MX8 memory module having memory devices stacked according to the present invention.
Figure 8:
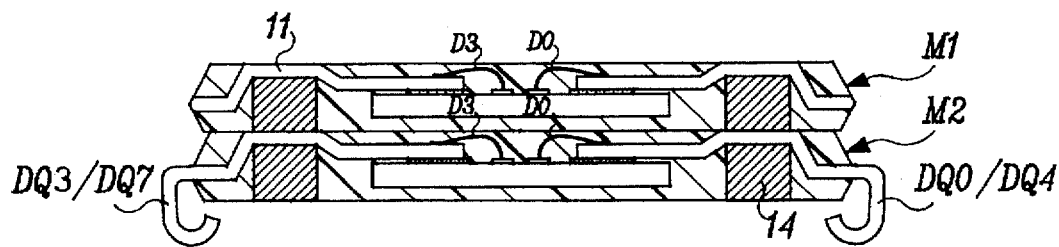
FIG. 8 is a cross sectional view of the three dimensional stack package of FIG. 7.

FIGS. 7 and 8 show another embodiment of the memory module in which two memory chip are stacked in three dimensional fashion. Referring to FIG. 7, the memory device M1 and M2 are 4MX4 DRAMs and have four data input/out pins D0 to D3 which are connected to module input/out pins DQ0 to DQ7. Unlike the embodiment of FIGS. 5 and 6, the memory devices M1 and M2 are selected by separate control signals RAS0 and RAS1. For example, if RAS0 is active low and RAS1 is inactive high, only the memory device M1 is activated and the module unit can communicate with an external system through the terminals DQ0 to DQ3. Of course, it is possible to select the memory devices by employing two separate CAS control signals (e.g., CAS0 and CAS1) instead of the RAS0 and RAS1 control signals.

Two memory devices are stacked three dimensionally as shown in FIG. 8. Because the data input and output of different memory devices cannot collide, all of the data input/output terminals D0 to D3 of the memory devices are electrically connected to their corresponding inner leads by bonding wires. This can save areas for NC leads.

Figure 9A:
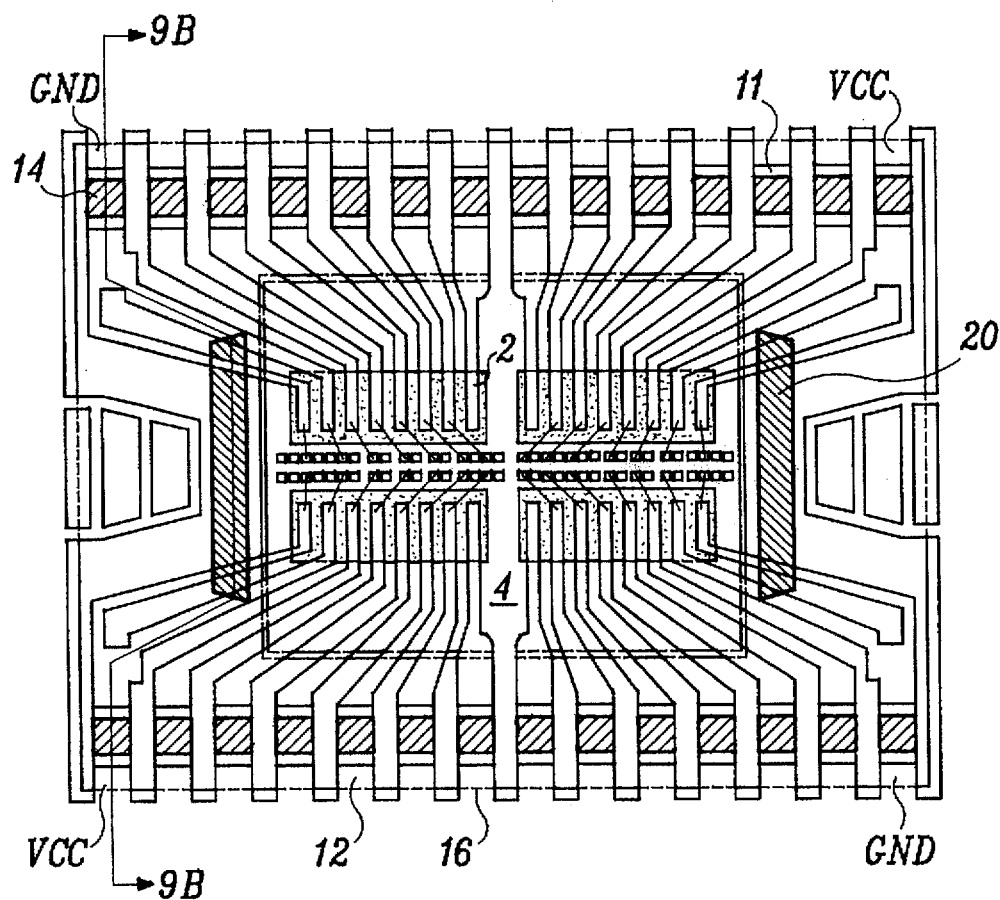
FIGS. 9A and 9B are, respectively, a plan view and a front cross sectional view of an embodiment of the three dimensional stack package devices comprising a capacitor according to the present invention.
Figure 9B:
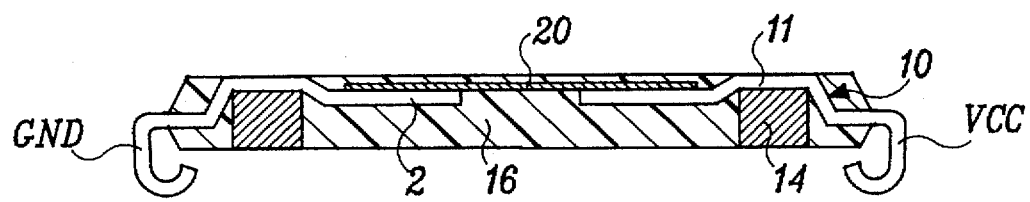

FIG. 9A is a plan view of an individual chip package having a capacitor suitable for use in the three dimensional stack package device according to the present invention, and FIG. 9B is a cross sectional view taken along the line 9B—9B in FIG. 9A. The capacitor 20 is connected between power supply terminal Vcc and the ground terminal GND so that power noise of the chip can be effectively improved. The power noise is increased when the operation speed, i.e., the operational frequency of the semiconductor device, becomes higher and when several input/output pins of a high pin count package device output '0' or '1' data simultaneously. Accordingly, the power noise problem must be taken into consideration in high pin count, high speed semiconductor devices. The capacitor 20 is contained in the package body 16 and connected between internal lead portions corresponding to the power supply terminal Vcc and the ground terminal GND.

Figure 10A:
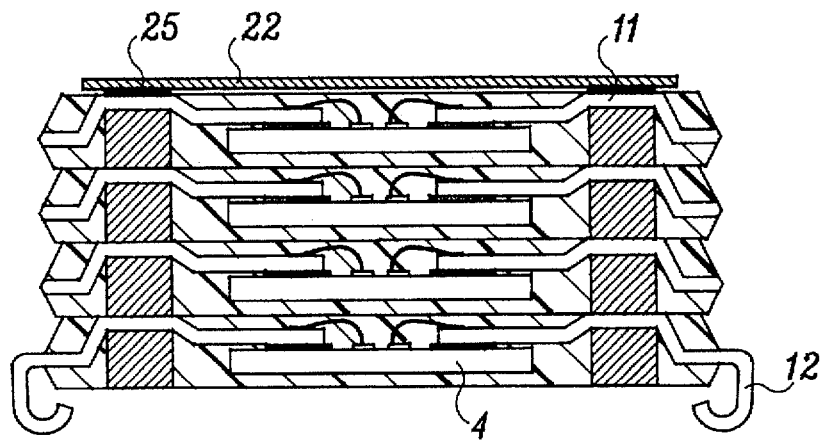
FIGS. 10A and 10B are, respectively, a front cross sectional view and a plan view of another embodiment of the three dimensional stack package devices comprising a capacitor according to the present invention.
Figure 10B:
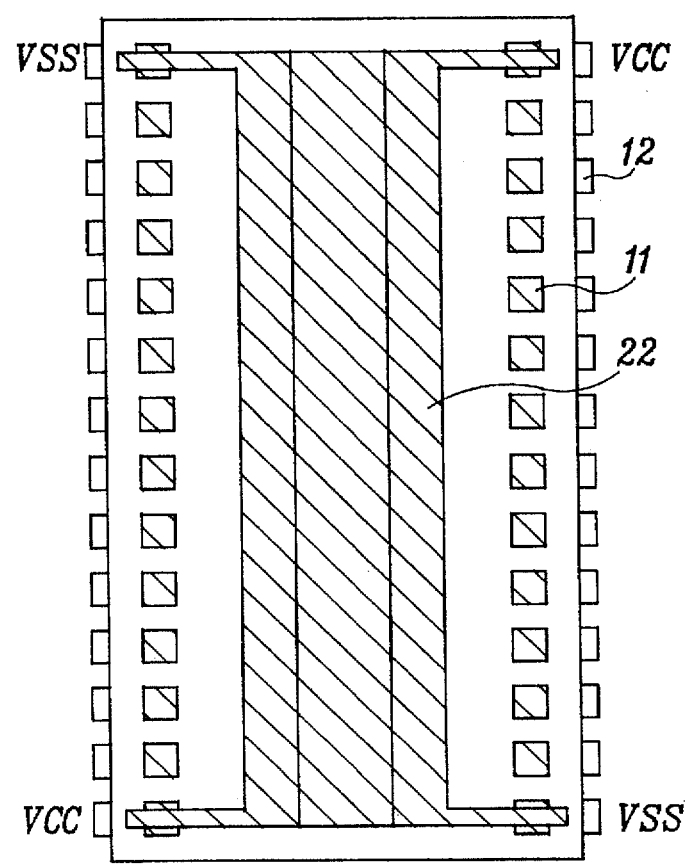

FIGS. 10A and 10B are, respectively, a front cross sectional view and a plan view of an individual chip package having another exemplary capacitor suitable for use in the three dimensional stack package device according to the present invention. The capacitor 22 is electrically interconnected between the power supply terminal Vcc and the ground terminal GND by using the coupling leads 11 which are exposed from the top surface of the three dimensional stack package device. Adherence of the coupling leads 11 and the capacitor 25 is made by an adhesive material 25. The adhesive 25 may be either electrically conductive or insulating, depending on the capacitance value required to improve the power noise. As compared to the embodiment of FIG. 7, more space is available for the capacitor attachment so that the power noise can be more effectively reduced.

Figure 11A:
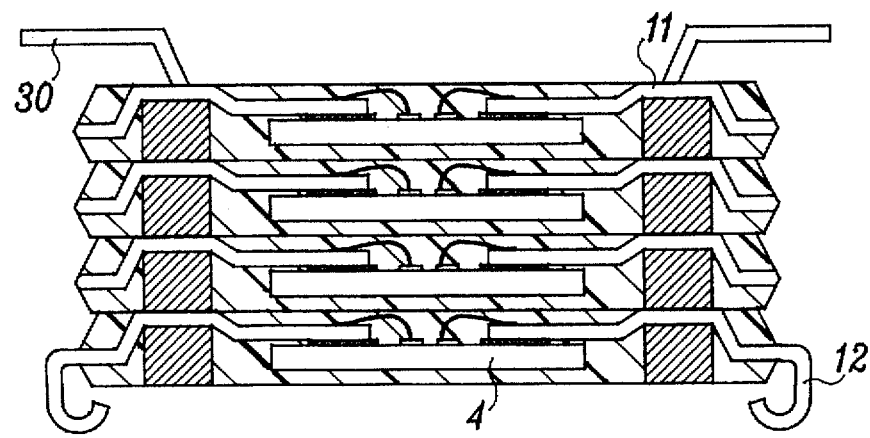
FIGS. 11A and 11B are, respectively, a cross sectional view and a plan view of a three dimensional stack package devices according to the present invention which is connected to probe pins for an electrical test of the device.
Figure 11B:
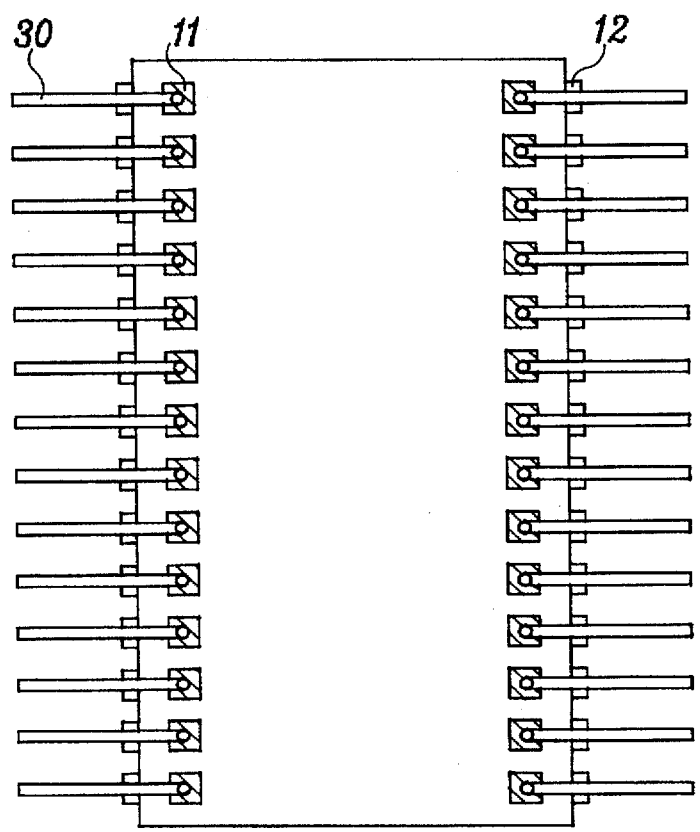

FIGS. 11A and 11B are, respectively, a cross sectional view and a plan view for showing a test procedure for the three dimension package device according to the present invention. While each of the individual chip package devices has passed an electrical characteristic tests, the devices may still fail due to the stacking process, therefore it is still a requirement to test the functionality of the final staked device. Each of the test probes 30 are connected to a test board having predetermined test patterns (not shown) at one end thereof. Test signals from a test machine (not shown) are delivered to the coupling leads 11 exposed from the top surface of the stacked device via the test board and the test probes 30. By reviewing the results from the outer leads of the stacked package device, it can be determined whether the device has passed or failed. With the present invention, the test probes 30 do not contact the outer leads so that damage and deformation of the outer leads during the test can be prevented. A test socket can be provided with less difficulty due to the fact that no additional test rig is required.

Figure 12:
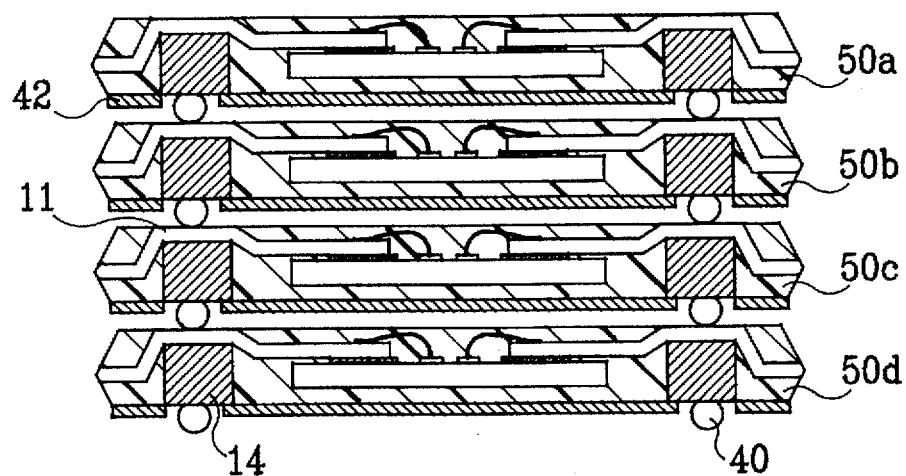
FIG. 12 is a cross sectional view of another embodiment of the three dimensional stack package device according to the present invention which uses solder balls.
Figure 13:
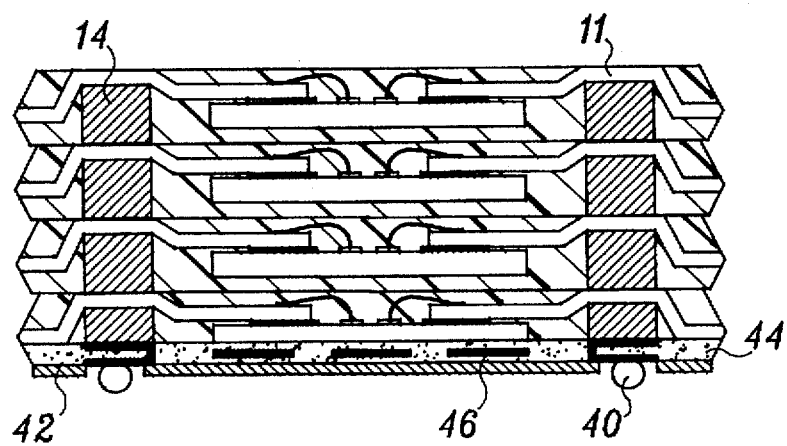
FIG. 13 is a cross sectional view of another embodiment of the three dimensional stack package device according to the present invention which uses solder balls.
Figure 14:
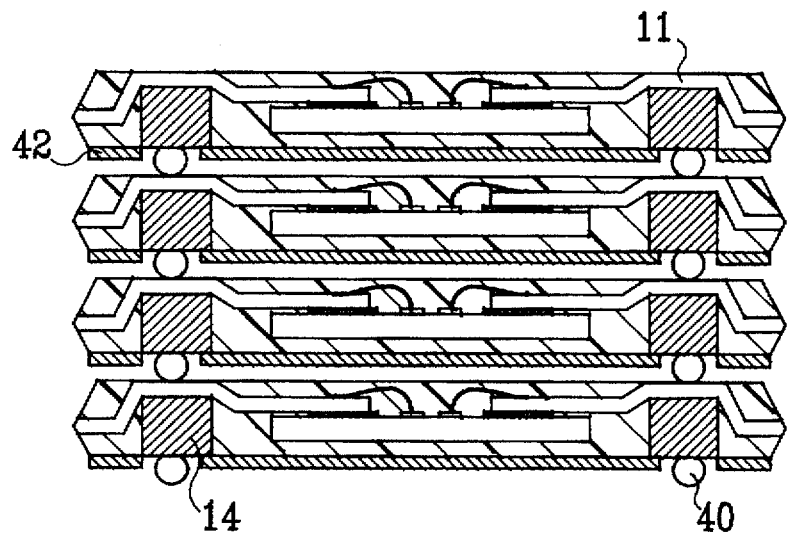
FIG. 14 is a cross sectional view of another embodiment of the three dimensional stack package device according to the present invention which uses solder balls.

FIGS. 12 to 14 are three additional embodiments of the present invention in which a plurality of solder balls are employed in the three dimensional stack package device. Referring to FIG. 12, individual BGA packages 50a, 50b, 50c and 50d are stacked in a vertical direction. Solder resist 42 is deposited on bottom surfaces of the individual BGA packages except for the vertical interconnection means 14, which are exposed from the bottom surfaces. A number of solder balls 40 are placed on the respective ones of the vertical interconnections means 14, and then attached to the vertical interconnection means 14 by a reflow soldering method. This structure is suitably applied when the pins required for the stacked package device is very high, which usually results in electrically shorted circuits between the fine pitched leads. When the coupling leads 11 and the vertical interconnection means 14 are joined by the reflow soldering, a solder cream which is mixture of finely powered solder in a viscous vehicle, is generally applied to the coupling lead 11. The solder cream, however, may cause an electrical short to the fine pitched leads. Though the overall height (diameter of the solder ball produced, multiplied by the number of the stacked individual chip packages) of the three dimensional stack package device is increased, this disadvantage is overcome somewhat since the solder balls can prevent electrical shorts of the fine pitched leads, and heat dissipation can be improved by virtue of the spaces between interfaces of the neighboring chip packages. It is the choice of the designer whether the vertical interconnection means and the coupling leads are contacted directly or whether solder balls are used.

Referring to FIG. 13, a circuit board 44 having conductive wiring patters 46 is attached to the bottom surface of the lowermost individual chip package. On the back surface of the circuit board 44, the solder resist 42 is deposited as explained above and solder balls 40 are attached and electrically connected to the conductive wiring patterns 46. The solder balls 40 are electrically interconnected to the vertical interconnection means 14 via the conductive wiring patterns 46. In this structure, since the solder balls are arranged in an array, the final stacked package device can be mounted on an external circuit board with less consideration given to the lead pitch than the embodiment of the FIG. 12.

The embodiment of FIG. 14, like that of FIG. 12, shows that the coupling leads 11 and the vertical interconnection means 14 are coupled by the solder balls 40 for preventing electrical shorted leads. However, outer leads of the lowermost individual chip package are, unlike that of FIG. 12, formed in a J-shape, taking into consideration the compatibility with the conventional circuit board for surface mounting.

Figure 15:
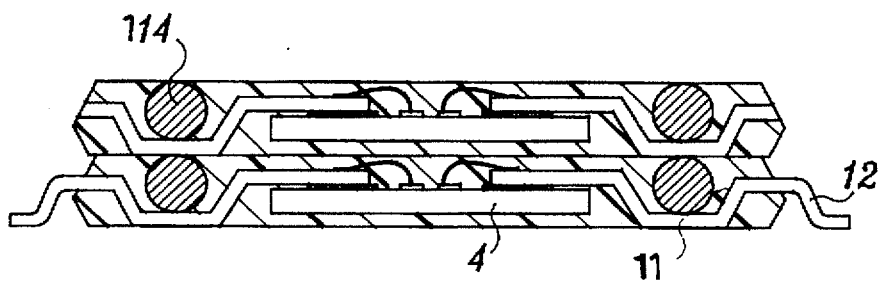
FIG. 15 is a cross sectional view of another embodiment of the present invention in which metal balls are used as the vertical interconnection means.

FIG. 15 shows another embodiment of the present invention in which metal balls are employed as the vertical interconnection means. The metal balls 114 made of copper, for example, are attached to backside of the coupling leads 11 after the lead frame leads are bent to form the coupling lead portions. The metal balls 114 and the coupling leads 11 electrically interconnect the upper and the lower individual package devices.

As explained so far, the present invention can be applied to almost all types of conventional plastic package devices and can take advantage of existing automatic assembly processes and apparatuses by simply changing the shapes of the lead frames. In particular, with the present invention, the stacked structure of the final three dimensional package device is very stable and therefore more individual chip packages can be stacked. Moreover, the heat dissipation capability is greatly improved.

While the present invention has been described with reference to the particular illustrative embodiments, it is not restricted to those embodiments, it being understood that those skilled in the art can change or modify the embodiments without departing from the scope and spirit of the present invention as set forth in the appended claims.

What is claimed is:

1. A three dimensional stack package device comprising a plurality of individual semiconductor devices, each of said plurality of individual semiconductor devices comprising:

a semiconductor chip;

a protective body for encapsulating said semiconductor chip;

a lead frame comprising
   inner lead portions which are electrically interconnected to the semiconductor chip and included within the protective body,
   outer lead portions formed as a single body with the inner lead portions, and
   coupling lead portions located between the inner and the outer lead portions and having a top surface exposed upward from the protective body; and a plurality of vertical interconnection means attached to a back surface of the coupling lead portions and exposed from the protective body in a direction opposing the exposed top surface of the coupling lead portions, wherein, an electrical interconnection of the plurality of individual semiconductor devices is accomplished by the coupling lead portions and the vertical interconnections means, and an electrical interconnection of the three dimensional stack package device to an external circuit device is accomplished by the outer lead portions of a lowermost semiconductor device.

2. The three dimensional stack package device as claimed in claim 1, wherein the outer lead portions of the lowermost individual semiconductor device are protruding from the protective body and formed into a shape, and the outer lead portions of the remaining of the plurality of semiconductor devices are cut off and removed.

3. The three dimensional stack package device as claimed in claim 2, wherein the outer lead portions of the lowermost individual semiconductor device are formed into a J-shape so that the three dimensional device can be surface-mounted on a external circuit board.

4. The three dimensional stack package device as claimed in claim 2, wherein the outer lead portions of the lowermost individual semiconductor device are formed into a gull-wing shape so that the three dimensional device can be surface-mounted on a external circuit board.

5. The three dimensional stack package device as claimed in claim 2, wherein the outer lead portions of the lowermost individual semiconductor device are formed into a shape for the three dimensional device to be mounted on an external circuit board in a pin insertion manner.

6. The three dimensional stack package device as claimed in claim 1, wherein the outer lead portions of said plurality of individual semiconductor devices are all cut off and removed, wherein the exposed vertical interconnection means of the lowermost individual semiconductor device are attached with a first plurality of solder balls, and the electrical interconnection of the three dimensional stack package device is accomplished by said first plurality of solder balls.

7. The three dimensional stack package device as claimed in claim 2, wherein the coupling lead portions of a lower of said plurality of individual semiconductor devices, and the vertical interconnection means of an upper of said plurality of individual semiconductor devices, are coupled by way of a second plurality of solder balls, such that spaces are formed between the upper and the lower individual semiconductor devices so that heat from the individual semiconductor devices are dissipated through the spaces.

8. The three dimensional stack package device as claimed in claim 6, wherein the coupling lead portions of a lower of said plurality of individual semiconductor devices, and the vertical interconnection means of an upper of said plurality of individual semiconductor devices, are coupled by way of a second plurality of solder balls, such that spaces are formed between the upper and the lower individual semiconductor devices so that heat from the individual semiconductor devices are dissipated through the spaces.

9. The three dimensional stack package device as claimed in claim 1, wherein the vertical interconnection means have a shape of right-hexahedron.

10. The three dimensional stack package device as claimed in claim 1, wherein the vertical interconnection means are made of a same material as the lead frame.

11. The three dimensional stack package device as claimed in claim 1, wherein both the exposed coupling lead portions and the exposed vertical interconnection means are plated with a tin-lead alloy.

12. The three dimensional stack package device as claimed in claim 1, wherein the coupling lead portions and the vertical interconnection means are coupled by a thermal-compression method.

13. The three dimensional stack package device as claimed in claim 1, wherein the inner lead portions are attached to a top surface of the individual semiconductor device, and the inner lead portions are electrically interconnected to the individual semiconductor devices by way of bonding wires.

14. The three dimensional stack package device as claimed in claim 1, wherein the inner lead portions are electrically interconnected to the individual semiconductor devices by way of metal bumps.

15. The three dimensional stack package device as claimed in claim 1, wherein said plurality of individual semiconductor devices are memory devices, and first inner leads of each memory device, which are associated with address signals, controlling signals for selecting row addresses and column addresses and power supply signals, are arranged at same positions with respect to corresponding inner leads of its neighboring upper and lower memory devices, while second inner leads of each memory device, which are associated with input and output data, are arranged in different positions with respect to corresponding inner leads of its neighboring upper and lower memory devices.

16. The three dimensional stack package device as claimed in claim 1, wherein said plurality of individual semiconductor devices comprise power supply leads, ground leads and a capacitor connected between the power supply and ground leads.

17. The three dimensional stack package device as claimed in claim 1, wherein said plurality of individual semiconductor devices comprise power supply leads and ground leads, and a capacitor is connected between the exposed coupling lead portions corresponding to the power supply leads and ground leads.

18. The three dimensional stack package device as claimed in claim 1, wherein the exposed coupling lead portions of an uppermost individual semiconductor device is attached to probe pins for testing the three dimensional stack package device.

19. The three dimensional stack package device as claimed in claim 1, wherein said vertical interconnection means are attached to the coupling lead portions by a method comprising the steps of: attaching a column of right-hexahedron shaped material to the back side of the coupling lead portions in a direction that the inner leads are arranged; and cutting and removing portions of the column of right-hexahedron material between neighboring inner leads.

20. The three dimensional stack package device as claimed in claim 1, wherein the outer leads portions of said plurality of individual semiconductor devices are cut off and removed, a circuit board is, at its top surface, attached to a back side of the lowermost semiconductor device, said circuit board comprising a third plurality of solder balls bonded to a bottom surface thereof and conductive wiring patterns which are electrically interconnected both to the exposed coupling lead portions of the lowermost semiconductor device and to the third plurality of solder balls, so that the electrical interconnection of the three dimensional stack package device is accomplished by the third plurality of solder balls.

21. The three dimensional stack package device as claimed in claim 20, wherein said third plurality of solder balls are disposed in an array at the bottom surface of the circuit board.

22. The three dimensional stack package device as claimed in claim 2, wherein said exposed coupling lead portions and vertical interconnection means are protruding from the protective body so that air paths are formed between upper and lower of said plurality of individual semiconductor devices.

23. The three dimensional stack package device as claimed in claim 6, wherein said exposed coupling lead portions and vertical interconnection means are protruding from the protective body so that air paths are formed between upper and lower of said plurality of individual semiconductor devices.

24. The three dimensional stack package device as claimed in claim 2, wherein the electrical interconnection of the coupling lead portions and the vertical interconnection means are accomplished by a method comprising the steps of: depositing solder creams on the exposed coupling lead portions; aligning the coupling lead portions with the vertical interconnection means; and heating the coupling lead portions and the vertical interconnection means to about 180° C.

25. The three dimensional stack package device as claimed in claim 6, wherein the electrical interconnection of the coupling lead portions and the vertical interconnection means are accomplished by a method comprising the steps of: depositing solder creams on the exposed coupling lead portions; aligning the coupling lead portions with the vertical interconnection means; and heating the coupling lead portions and the vertical interconnection means to about 180° C.

26. The three dimensional stack package device as claimed in claim 7, wherein the coupling lead portions and the vertical interconnection means are accomplished by a method comprising the steps of: plating solder resists on the back side of the individual semiconductor device expect for the exposed vertical interconnection means; aligning the coupling lead portions, vertical interconnection means and the second plurality of solder balls; and heating the coupling lead portions, vertical interconnection means and the second plurality of solder balls.

27. The three dimensional stack package device as claimed in claim 8, wherein the coupling of the coupling lead portions and the vertical interconnection means are accomplished by a method comprising the steps of: plating solder resists on the back side of the individual semiconductor device expect for the exposed vertical interconnection means; aligning the coupling lead portions, vertical interconnection means and the second plurality of solder balls; and heating the coupling lead portions, vertical interconnection means and the second plurality of solder balls.

28. The three dimensional stack package device as claimed in claim 1, wherein the vertical interconnection means are metal balls.

* * * * *